United States Patent
Lerner

(10) Patent No.: US 10,355,157 B2
(45) Date of Patent: Jul. 16, 2019

(54) PHOTOVOLTAIC CELLS

(71) Applicant: Columbus Photovoltaics LLC, Rego Park, NY (US)

(72) Inventor: Corey E. Lerner, New York, NY (US)

(73) Assignee: Columbus Photovoltaics LLC, Rego Park, NY (US)

( * ) Notice: Subject to any disclaimer, the term of this patent is extended or adjusted under 35 U.S.C. 154(b) by 117 days.

(21) Appl. No.: 14/531,037

(22) Filed: Nov. 3, 2014

(65) Prior Publication Data

US 2015/0122317 A1    May 7, 2015

Related U.S. Application Data

(60) Provisional application No. 61/899,400, filed on Nov. 4, 2013.

(51) Int. Cl.
*H01L 31/07* (2012.01)
*H01L 31/065* (2012.01)

(52) U.S. Cl.
CPC ........... *H01L 31/065* (2013.01); *H01L 31/07* (2013.01); *Y02E 10/50* (2013.01)

(58) Field of Classification Search
CPC .. H01L 31/065; H01L 31/07; Y02E 10/50–58
USPC ................................................ 136/243–265
See application file for complete search history.

(56) References Cited

U.S. PATENT DOCUMENTS

| | | |
|---|---|---|
| 4,200,473 A | 4/1980 | Carlson |
| 4,317,844 A | 3/1982 | Carlson |
| 4,477,688 A * | 10/1984 | Barnett ............ H01L 29/26 136/255 |
| 4,726,850 A | 2/1988 | Wenham et al. |
| 2003/0037815 A1 | 2/2003 | Kim et al. |
| 2006/0234505 A1 * | 10/2006 | Asano ............ B82Y 10/00 438/688 |
| 2007/0028957 A1 | 2/2007 | Lewerenz |
| 2007/0137698 A1 * | 6/2007 | Wanlass ............ H01L 31/042 136/261 |

(Continued)

FOREIGN PATENT DOCUMENTS

| | | |
|---|---|---|
| CN | 102870233 A | 1/2013 |
| GB | 2384621 A | 7/2003 |

(Continued)

OTHER PUBLICATIONS

Yerokhov et al. "Influence of External Bias on Photoelectric Properties of Silicon MIS/IL Structures." Solid-State Electronics vol. 42, No. 6, pp. 883-889, 1998. (Year: 1998).*

(Continued)

*Primary Examiner* — Liesl C Baumann
(74) *Attorney, Agent, or Firm* — Lerner, David, Littenberg, Krumholz & Mentlik, LLP

(57) ABSTRACT

A photovoltaic cell incorporating a semiconductor element (10) composed entirely of a single conductivity type. A biasing agent (26) having a work function different from that of the semiconductor element overlies a face of the element and produces a band bending and thus an electric field in a space charge region. Electrodes are in contact with the semiconductor element within the space charge region. Carriers generated by light absorbed in the semiconductor element are accelerated toward the electrodes by the field.

15 Claims, 4 Drawing Sheets

(56) References Cited

U.S. PATENT DOCUMENTS

| | | | |
|---|---|---|---|
| 2009/0151776 A1* | 6/2009 | Schindler | B82Y 10/00 136/251 |
| 2011/0146766 A1* | 6/2011 | Nozik | B82Y 20/00 136/255 |
| 2012/0060918 A1* | 3/2012 | Spitzer | H01L 31/055 136/257 |
| 2012/0073647 A1* | 3/2012 | Stangl | H01L 31/022441 136/256 |
| 2012/0091453 A1* | 4/2012 | Grundmann | H01L 31/108 257/43 |
| 2012/0312371 A1 | 12/2012 | Rinzler et al. | |
| 2013/0221415 A1* | 8/2013 | Regan | H01L 29/68 257/288 |

FOREIGN PATENT DOCUMENTS

| | | |
|---|---|---|
| JP | S5450288 A | 4/1979 |
| JP | S5543887 A | 3/1980 |
| JP | S55121687 A | 9/1980 |
| JP | 2002252358 A | 9/2002 |
| TW | 201229010 A | 7/2012 |
| TW | M514112 U | 12/2015 |
| WO | WO 2011139754 A2 * 11/2011 ..... H01L 31/022433 |

OTHER PUBLICATIONS

Shewchun et al. "Theory of metal-insulator-semiconductor solar cells." Journal of Applied Physics 48, 765 (1977); doi: 10.1063/1.323667 (Year: 1977).*

Search Report of Taiwanese Patent Application No. 104112820 dated Oct. 4, 2016.

International Search Report and Written Opinion for Application No. PCT/US2014/063635 dated Mar. 13, 2015.

Koenig D et al: "New Approach to a Unipolar Thin Film Schottky Solar Cell", 2nd World Conference on Photovoltaic Solar Energy Conversion, / 15th European PV Solar Energy Conference, / 27th US IEEE Photovoltaics Specialists Conference. / IOTH Asia/Pacific PV Science and Engineering Conference, Vienna, Austria, Jul. 6-10, 19, Jul. 6, 1998 (Jul. 6, 1998), pp. 1850-1853, XP001138085.

* cited by examiner

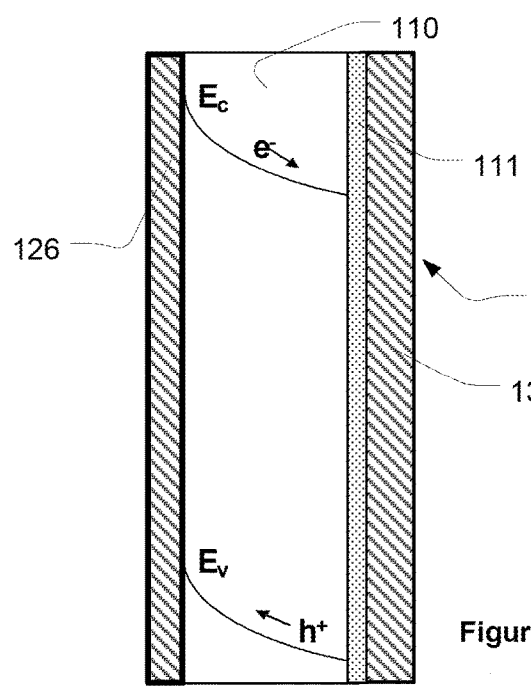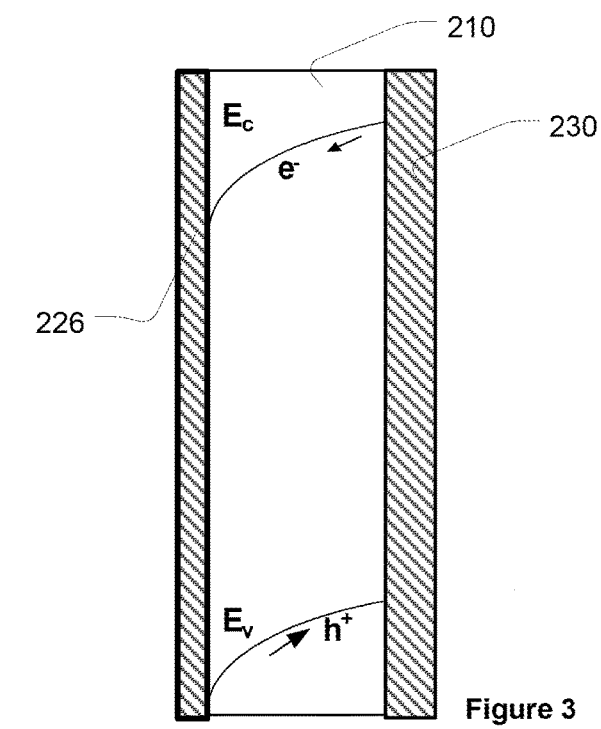
Figure 2
Figure 3

PHOTOVOLTAIC CELLS

CROSS-REFERENCE TO RELATED APPLICATIONS

The present application claims the benefit of the filing date of U.S. Provisional Patent Application No. 61/899,400, entitled HIGH BAND GAP SOLAR CELLS WITHOUT SEMICONDUCTOR JUNCTIONS, filed Nov. 4, 2013, the disclosure of which is hereby incorporated herein by reference.

BACKGROUND OF THE INVENTION

The present invention relates to photovoltaic cells. Considerable effort has been devoted in the art heretofore to development of photovoltaic cells, i.e., semiconductor devices that can convert light into electrical energy. Typically, such cells incorporate multiple layers of semiconductor materials including n-type semiconductor, where the predominant or majority charge carriers are electrons, and p-type semiconductor, in which the majority charge carriers are holes. These layers cooperatively define a p-n junction. Electrodes are provided in contact with the semiconductor materials on opposite sides of the junction. When isolated from one another, p-type material and the n-type material have different Fermi levels due to differing doping. The Fermi level is an energy level such that the probability of the level being filled with electrons is 50%. When the p-type and n-type materials are united with one another at the p-n junction of the cell, the Fermi levels come into equilibrium with one another and a space charge region forms. The space charge region provides an electric field in the vicinity of the junction. As light impinges on the semiconductor material, incoming photons cause electrons to be promoted from the valence band of the semiconductor material to the conduction band, thus creating an increased number of charge carriers. The term "band gap" refers to the difference in energy between the valance band of a semiconductor material and the conduction band of that material.

The electric field of the space charge region accelerates the charge carriers across the p-n junction. The holes and electrons move in opposite directions. The electrons pass to a first electrode in contact with the n-type material, whereas the holes pass towards a second electrode in contact with the p-type material. This creates a difference in electrical potential between the electrodes and thus creates useful, available electrical energy at the electrodes. An external circuit connected to the electrodes can utilize this electrical energy.

The voltage or potential difference available from such p-n junction cells is limited. The maximum voltage output from such a cell is limited by the difference between the energy level of the conduction band in n-type material and the energy level of the valence band in the p-type material. This difference typically is less than the band gap of the semiconductor. It is desirable to form photovoltaic cells from materials having wide bandgaps as, for example, about 1.7 electron volts or more. Wide bandgap materials can efficiently absorb light at wavelengths of about less than 800 nanometers. Such light is in the visible and ultraviolet portions of the spectrum and constitutes a substantial portion of the solar energy impinging on the Earth. Moreover, cells formed from wide bandgap materials can be used in conjunction with cells formed from narrow bandgap materials. In such an arrangement, the wide bandgap cell is disposed in front of a narrow bandgap cell. Long wavelength light is not absorbed by the wide bandgap cell and passes through to the narrow bandgap cell, where it is absorbed.

p-n junction cells formed from silicon can be made by relatively inexpensive processes such as dopant implantation into silicon wafers. However, silicon has a bandgap of 1.12 eV. Manufacture of p-n junction cells in certain wide bandgap semiconductor materials requires formation of multiple layers by a sequential process of epitaxial deposition. In an epitaxial deposition process, the material is grown on a substrate by depositing materials, most typically from a vapor or gas state, on an existing solid crystal, so that the grown crystal forms in a structure having crystal lattice spacing determined by the lattice spacing of the substrate. However, it can be difficult to grow high-quality semiconductor materials of opposite conductivity types using certain wide bandgap semiconductor materials. Thus, despite the considerable effort in the art heretofore to development of photovoltaic cells, further improvement would be desirable.

BRIEF SUMMARY OF THE INVENTION

A photovoltaic cell according to one embodiment of the invention desirably includes a semiconductor element having a front face, a rear face, and a thickness direction between the faces. The semiconductor element desirably is composed entirely of n-type semiconductor or entirely of p-type semiconductor. A biasing agent desirably overlies a first one of the faces of the semiconductor element. The biasing agent desirably has a Fermi level or work function different from the normal Fermi level or work function of the semiconductor element. The biasing agent produces band bending in the semiconductor element, so that a space charge region exists within the semiconductor element and there is a unidirectional potential gradient in the thickness direction throughout the space charge region. The cell desirably also includes front and rear electrodes spaced apart from one another in the thickness direction, each of the electrodes being in contact with semiconductor element within the space charge region in the absence of illumination.

A further aspect of the invention provides methods of generating electricity. A method according to this aspect of the invention desirably includes maintaining a unidirectional potential gradient in a gradient direction throughout a space charge region of a semiconductor element consisting entirely of p-type or entirely of n-type semiconductor. The method desirably also includes directing light into the space charge region while maintaining the potential gradient so that at least some of the light is absorbed by the semiconductor and the absorbed light promotes electrons from the valence band to the conduction band. The method most desirably further includes collecting a current at a pair of electrodes spaced apart from one another in the gradient direction and in contact with the semiconductor within or adjacent the space charge region. Most preferably during the collecting step, the electrodes are in contact with the semiconductor within the space charge region.

A photovoltaic cell according to a further aspect of the invention desirably includes a semiconductor element having first and second faces and a thickness direction between the faces. A biasing agent desirably overlies only a first portion of the first face and produces band bending in the semiconductor element. A first electrode preferably overlies and contacts a second portion of the first face separate from the first portion. In this aspect of the invention, the first electrode desirably is out of direct conductive contact with the biasing agent. The cell according to this aspect of the invention desirably includes a second electrode contacting the semiconductor element at a location spaced apart from the first face.

BRIEF DESCRIPTION OF THE DRAWINGS

FIGS. 2 and 3 are diagrammatic sectional views depicting cells in accordance with further embodiments of the invention.

DETAILED DESCRIPTION

Figure 1:
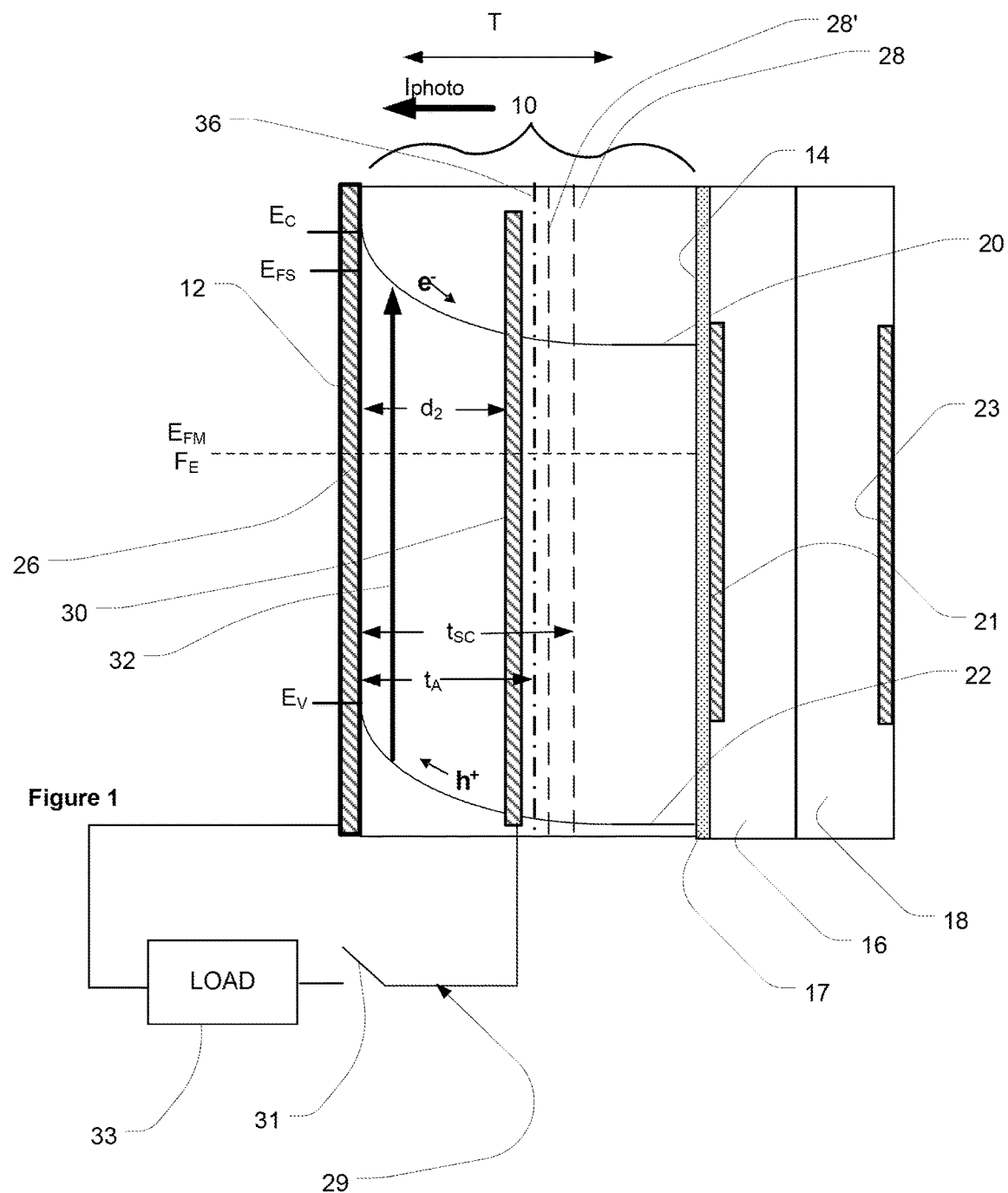
FIG. 1 is a diagrammatic sectional view of a photovoltaic cell in accordance with one embodiment of the invention connected to an external circuit.

A photovoltaic cell according to one embodiment of the invention includes a semiconductor element 10 having a front face 12, a rear face 14, and a thickness direction extending between these faces. As used herein, and as normally understood in the art, a thickness direction extending between faces of a solid object is the direction of the shortest line between the two faces. Where the two faces are parallel to one another, as in FIG. 1, the thickness direction is the direction normal to the faces. In the depicted embodiment, the thickness direction is the horizontal direction indicated by arrow T in FIG. 1. Semiconductor element 10 optionally may be unitary with one or more additional semiconductor or substrate layers 16, 17, and 18. In this embodiment, the additional layers are remote from that region of the semiconductor body 10 that plays a role in generation of electrical energy and, accordingly, the additional layers can be of substantially any composition and any conductivity type. For example, the additional layers may include an electrically insulating layer 17 and layers 16 and 18 formed from a semiconductor having a smaller band gap than the semiconductor in element 10. Layers 16 and 18 may be of opposite conductivity types, and thus may define a conventional p-n junction cell having electrodes schematically depicted at 21 and 23.

In this embodiment, semiconductor element 10 consists entirely of semiconductor material having a single conductivity type. In the example illustrated, the conductivity type is n-type. The semiconductor can be essentially any semiconductor as, for example, a III-V semiconductor such as those including one or more Group III elements selected from the group consisting of as gallium, indium, and aluminum and one or more Group V elements selected from the group consisting of nitrogen, phosphorous, arsenic, and antimony. Alternatively, the semiconductor material can be a II-VI semiconductor including one or more Group II metals selected from the group consisting of cadmium, zinc, and mercury and one or more Group VI elements selected from the group consisting of as oxygen, sulphur, selenium, and tellurium. The semiconductor may also be a Group IV semiconductor such as silicon or silicon carbide. The semiconductor may be undoped, may be intentionally doped by addition of one or more dopants to the nominal semiconductor, or may be unintentionally doped as, for example, by crystal lattice vacancies. For example, gallium nitride may be formed in an unintentionally doped n-type semiconductor in common epitaxial growth processes. The dopants and other particulars of the semiconductor per se may be conventional.

In FIG. 1, it is assumed that the additional layers 16, 17, and 18 do not influence the electronic state of the semiconductor, Properties of a material undisturbed by outside influences are referred to herein as the "normal" properties of the material. The material has a conduction band and a valence band. The normal energy level of the conduction band is denoted $E_C$ and the normal the energy level of the valence band denoted $E_V$. In an n-type semiconductor as shown, the normal Fermi level $E_{FS}$ is below the normal conduction band level $E_C$.

A layer of a biasing material 26 overlies the front surface 12 of the semiconductor element 10. In this example, the biasing material 26 is applied as a thin layer, so that the biasing material is transparent to light in the wavelengths that are absorbed by the semiconductor. As used in this disclosure, the term "transparent" denotes an element such that a substantial portion of light in the wavelengths of interest will be transmitted through the element. Perfect transparency, i.e., 100% transmission, is not required. Where, as here, semiconductor element 10 is n-type, biasing material 26 has a normal Fermi level $E_{FM}$ below the normal Fermi level $E_{FS}$ of the semiconductor. Stated another way, the work function $\Phi m$ of the biasing material is greater than the work function of the semiconductor in its normal state. The work function of a material is the energy required to move an electron from the Fermi level of the material to a vacuum. The work function of a metal is also referred to as the "electron affinity" of the metal. In the particular example depicted, biasing material 26 is an electrically conductive metal. For example, where semiconductor element 10 is a II-VI semiconductor such as cadmium sulfide n doped to $10^{17}$ having a work function of about 4.2 electron volts ("eV"), biasing material 26 may be a metal such as gold having a work function of about 4.78 eV. In this embodiment, biasing layer 26 is a layer of metal thin enough to be transparent. The metal is conductive, so that the biasing agent acts as a first electrode.

In FIG. 1, the semiconductor element and associated structures are shown in an open-circuit, dark condition. In this condition, there is no light falling on the semiconductor and no current flowing through the semiconductor. The work functions of the metal and semiconductor come into equilibrium at a level represented by a common Fermi level $F_E$. In the illustrated case of a metal and semiconductor, the equilibrium Fermi level $F_E$ is substantially equal to the normal Fermi level $F_M$ of the metal. Stated another way, the Fermi level of the semiconductor drops to the equilibrium Fermi level $F_E$. For this to occur, electrons are transferred from the semiconductor adjacent front surface 12 to the biasing agent. This leaves the semiconductor throughout a region of the semiconductor referred to herein as the "space charge region," also referred to as the "depletion region" adjacent the front surface 12 depleted in electrons, and thus positively charged, and leaves the biasing agent negatively charged. The charge in the biasing agent is concentrated in an extremely thin region, typically a few Angstroms thick, referred to as the "delta charge region" (not shown) abutting the front surface 12 of the semiconductor. An electron in the conduction band of the semiconductor adjacent the front surface is repelled by the negative charge on the biasing agent. At progressively greater distances from the front surface, the repulsion is reduced by progressively greater amounts of positively charged semiconductor intervening between the biasing agent and the electron. Stated another way, there is an electric field within the space charge region of the semiconductor. Any electron in the conduction band of the semiconductor within the space charge region has additional potential energy imparted by the electric field and thus is at a higher energy level than an electron in the conduction band outside the space charge region. This is represented by the upward bending of curve 20. Because the bandgap of the semiconductor is a fixed quantity, the energy level of the valence band also increases in the space charge region, as represented by the upward bending of curve 22. The term "band bending" is commonly used to describe the distortion of the energy levels within the space charge region. The magnitude of the upward bending in these curves is equal to the difference between the normal Fermi levels of the semiconductor 10 and the biasing agent 26. This difference is referred to as the "built in voltage" ("$V_{BI}$") of the metal-semiconductor junction. The strength of the electric field is represented by the slope of curve 20 and progressively declines to zero at the boundary of the space charge region, denoted by line 28 in FIG. 1. The thickness $t_{SC}$ of the space charge region under dark, open-circuit conditions depends upon the carrier concentration of the semiconductor as well as the built-in voltage $V_{BI}$ and the dielectric constant. The thickness $t_{SC}$ under these conditions is readily calculable by those skilled in the art. By way of example, approximate values of $t_{SC}$ for cadmium sulfide doped to various carrier concentrations at various built in voltages is shown in Table I, below. The maximum electric field $E_{MAX}$ is also shown in Table I.

TABLE I

| CdS n doping level | $10^{13}$ | $10^{15}$ | $10^{17}$ | $10^{19}$ |
|---|---|---|---|---|
| VBI 0.25 V | | | | |
| Thickness of space charge region $t_{sc}$ | 49000 A | 4900 A | 490 A | 49 A |
| $E_{MAX}$ (V/cm) | $1.0 \times 10^3$ | $1.0 \times 10^4$ | $1.0 \times 10^5$ | $1.0 \times 10^6$ |
| VBI 0.5 V | | | | |
| Thickness of space charge region $t_{sc}$ | 70000 A | 7000 A | 700 A | 70 A |
| $E^{MAX}$ (V/cm) | $1.46 \times 10^3$ | $1.46 \times 10^4$ | $1.46 \times 10^5$ | $1.46 \times 10^6$ |
| VBI 1.0 | | | | |
| Thickness of space charge region $t_{sc}$ | 98000 A | 9800 A | 980 A | 98 A |
| EMAX (V/cm) | $2.0 \times 10^3$ | $2.0 \times 10^4$ | $2.0 \times 10^5$ | $2.0 \times 10^6$ |

The photovoltaic cell in accordance with this embodiment also includes a second electrode 30. The second electrode 30 is spaced apart from the front surface 12 and from the first electrode 26 in the thickness direction. Stated another way, electrodes 26 and 30 do not touch one another and there is a non-zero distance $d_2$ between these electrodes in the thickness direction. A portion of semiconductor element 10 is disposed between these electrodes. The distance $d_2$ between front surface and second electrode 30 in the thickness direction is less than the thickness $t_{SC}$ of the space charge region under dark, open-circuit conditions. Stated another way, the second electrode is in contact with the semiconductor within the space charge region under dark, open-circuit conditions. Thus, both electrodes 26 and 30 are in contact with the space charge region of the semiconductor element 10. In this embodiment, electrode 30 is transparent to lower-energy photons that can pass through to the additional cell formed by layers 16 and 18. In practice, electrode 30 may include either a thin layer of a metal or a plurality of opaque conductors spaced apart from one another so that light can be transmitted through the spaces between the conductors. In the embodiment of FIG. 1, second electrode 30 is assumed to be ohmic contact with the semiconductor. Thus, it is assumed for purposes of illustration that second electrode 30 does not cause appreciable band bending or otherwise appreciably influence the configuration of the conduction bands within the space charge region. As will be appreciated from inspection of FIG. 1, there is a potential gradient in the thickness direction from the junction 12 between the biasing material 26 and the semiconductor to the second electrode. Stated another way, the direction of the gradient in this embodiment is the same as the thickness direction. An electrical circuit 29 schematically indicated in FIG. 1 as including a switch 31 and load 33 may be connected between electrodes 26 and 30.

In operation, light passes through the transparent biasing material 26 and into the semiconductor. Light is absorbed within a region of the semiconductor between the front surface 12 and a theoretical boundary 36. The light intensity $I_X$ at a depth X from the front surface 12 is given by the equation:

$$I_X = I_0 e^{-\alpha X}$$

Where:
$I_0$ is the intensity of the light at front surface 12; and
$\alpha$ is the absorption coefficient of the semiconductor for the light impinging on the semiconductor. Unless otherwise specified in this disclosure, the value of a should be taken as an average value for that portion of solar radiation having energy greater than the bandgap of the semiconductor.

As used in this disclosure the thickness $t_A$ of the absorption region is taken as equal to the depth x equal to $\alpha^{-1}$. At this depth, $T_X/T_0$ is equal to $e^{-1}$ or about 0.37. Stated another way, $t_A$ is the depth x at which about 63% of the incoming photons have been absorbed. This thickness $t_A$ may be greater than or less than the thickness $t_{SC}$ of the space charge region, but preferably $t_A$ is less than $t_{SC}$. Again by way of example, cadmium sulfide provides an absorption region about 4000 Angstroms thick.

Absorption of a photon of the light promotes an electron from the valence band to the conduction band. This is symbolized by arrow 32 in FIG. 1. Thus, absorption of light increases the carrier concentration of the semiconductor. The additional carriers formed as a result of photon energy are accelerated by the electrical potential gradient within the space charge region. Thus, the electrons travel away from the front surface and toward the second electrode, whereas the holes travel toward front surface 12 and the biasing material and electrode 26. The electrons pass to the second electrode 30, so that the second electrode becomes negatively charged with respect to the biasing agent and first electrode 26. The increase in the number of minority carriers (holes, in the n-type semiconductor shown) is particularly significant in relation to the small number of minority carriers present under dark conditions. Accumulation of minority carriers tends to reduce the thickness of the space charge region. This is indicated schematically by boundary 28' in FIG. 1. Desirably, the second electrode 30 is disposed within the reduced thickness of the space charge region, as shown in FIG. 1. For example, in a photovoltaic cell intended for terrestrial use, the second electrode desirably remains within the thickness of the space charge region when the cell is subjected to one Sun illumination. As used in this disclosure, the term "Sun" refers to light having an intensity of 1,000 watts per square meter and a spectrum corresponding to the spectrum of solar energy impinging on the Earth. This spectrum is referred as the AM 1.5 spectrum. The magnitude of the potential difference between the electrodes under open-circuit condition, with no current flowing in external circuit 30, will be less than the band gap of the semiconductor. When switch 31 is closed, the electrons will flow through the external circuit from second electrode 30 to the first electrode, in this case biasing material 26, and will combine with the holes. The internal current flow within the semiconductor is referred to as a photocurrent, and symbolized by the arrow $I_{PHOTO}$ in FIG. 1.

The electric field present within the space charge region causes the carriers, and particularly the electrons, to accelerate to relatively high velocities. Moreover, the relatively close spacing of the electrodes minimizes the distance to be traveled by the carriers. This is particularly important where the semiconductor constituting element 10 is a direct semiconductor and the photon absorption process is a direct absorption process. As used in this disclosure, the term "direct transition" refers to a process in which a photon is absorbed by a quantum transition of an electron from the valence band to the conduction band that does not require interaction with or generation of another particle or wave. Such a direct transition process should be contrasted with an indirect transition process, which typically involves an interaction with a "phonon," i.e., a vibrational wave within the semiconductor material. The term "direct semiconductor" refers to a semiconductor that is capable of absorbing photons in a direct transition process. Because a direct transition process involves the interaction of only two particles or waves, i.e., a photon and an electron, the absorption process is likely to occur if an impinging photon has energy at least equal to the band gap. Therefore, direct semiconductors function as very efficient absorbers. However, the reverse transition, i.e., an electron falling from the conduction band into the valance band, referred to as "carrier recombination," is also likely in a direct semiconductor. Stated another way, carrier recombination occurs far more rapidly in direct semiconductors than in indirect semiconductors. Because the carriers move rapidly in opposite directions within the region between the electrodes of the cell depicted in FIG. 1 and because the distance between the electrodes is small, a substantial number of carriers survive for sufficient time to reach the electrodes so that substantial current can be generated by the cell.

By contrast, in a conventional structure referred to as a "Schottky diode," the second electrode is in contact with the semiconductor at a location far outside of the space charge region. The carriers generated by photon absorption would have to diffuse through a large region of the semiconductor, which is not subject to the electric field associated with the space charge region. Thus, the carriers would have to endure a prolonged residence time before reaching the electrodes. An attempt to use such a Schottky diode structure formed from a direct semiconductor as a photovoltaic cell would suffer from extensive carrier recombination and produce decreased output current.

The cell incorporating semiconductor element 10 depicted in FIG. 1 can be made using a direct semiconductor. Moreover, the cell does not incorporate a p-n junction. Thus, this cell can be made from a wide variety of semiconductors. For example, semiconductors that are difficult to make in p-type can be used. Certain semiconductors exhibit n-type doping even in the absence of intentionally added dopants. When such semiconductors are used, the cell incorporating semiconductor element 10 can be fabricated without any intentional doping.

Photons having energy smaller than the bandgap of the semiconductor in element 10 pass through the semiconductor without being absorbed and pass through the transparent electrodes 30 and 21, so that they reach the additional photovoltaic cell constituted by layers 16 and 18. This cell absorbs these photons and produces a potential between electrodes 21 and 23. These electrodes can be connected to a further external circuit (not shown) of any configuration. In one example of such a circuit, the electrodes associated with additional layers 16 and 18 are connected in series with electrodes 26 and 30 associated with semiconductor element 10. Thus, the device as a whole functions as a composite cell, with short-wavelength light being absorbed and converted to power in the front cell including element 10 and with long-wavelength light being converted to power in the rear cell incorporating layers 16 and 18. In a further embodiment, the additional cell constituted by layers 16 and 18 may be omitted, and the second electrode 30 may be reflective. In such an arrangement, the second electrode redirects any unabsorbed light back into the space between the first and second electrodes. The reflected light will include some photons having energy greater than the bandgap of semiconductor element 10. These photons will be at least partially absorbed as they travel back towards the first electrode 26. In a further variant, the additional cell formed by layers 16 and 18 is provided as shown in FIG. 1, but second electrode 30 is formed as a selectively reflective structure. The structure reflects high-energy photons back toward the first electrode 26, but is transparent to lower-energy photons. In a variant of this arrangement, the rear cell may incorporate transparent electrodes, and one or more additional cells formed from low-bandgap semiconductors may be placed behind the rear cell, so that the additional cells absorb light at still lower wavelengths. In a further variant, the semiconductor body may include one or more additional cells in front of element 10, the additional cells being formed from semiconductors having greater bandgap than the material of element 10.

A photovoltaic cell according to a further embodiment of the invention (FIG. 2) is similar to the cell described above with reference to FIG. 1. In this case, however, the entire semiconductor element consists solely of a layer of semiconductor material disposed between the first electrode and biasing material 126 and the second electrode 130. In this embodiment, the entirety of the semiconductor element has a thickness less than the normal thickness of the space charge region. Here again, both electrodes are in contact with the space charge region. In this embodiment, the second electrode 130 includes a metal layer 131 and a thin layer 111 of highly doped semiconductor material in contact with the semiconductor element 110. In the particular example shown, the semiconductor 110 is again n-type and the layer 111 is what is commonly referred to as an n+ layer. Layer 111 is of the same conductivity type, i.e., n-type, as the remainder of semiconductor body 110, but has such a high carrier concentration that it acts in some respects like a metal. Such a layer can facilitate conduction between the semiconductor body 110 and the metal layer of second electrode 130. The substantial number of electrons arriving at the second electrode 130 helps to maintain a high concentration of electrons at the second electrode. If the concentration of electrons at the second electrode is high enough an $n^+$ layer formed by doping may be unnecessary.

A photovoltaic cell according to yet another embodiment of the invention (FIG. 3) is similar to that of FIGS. 1 and 2, except that the semiconductor body 210 is formed entirely from p-type semiconductor. In this instance, the biasing layer 226 is formed from a material having a Fermi level higher than that of the semiconductor 210 and a work function lower than that of the semiconductor. In this embodiment as well, the biasing material produces band bending in the semiconductor. Here again, the spacing or distance in the thickness direction between the biasing material 226 and the second electrode 230 is less than the thickness of the space charge region so that the second electrode 230 is disposed within the space charge region. Operation of this cell is essentially the same as discussed above, except that the direction of current flow is reversed.

Figure 4:
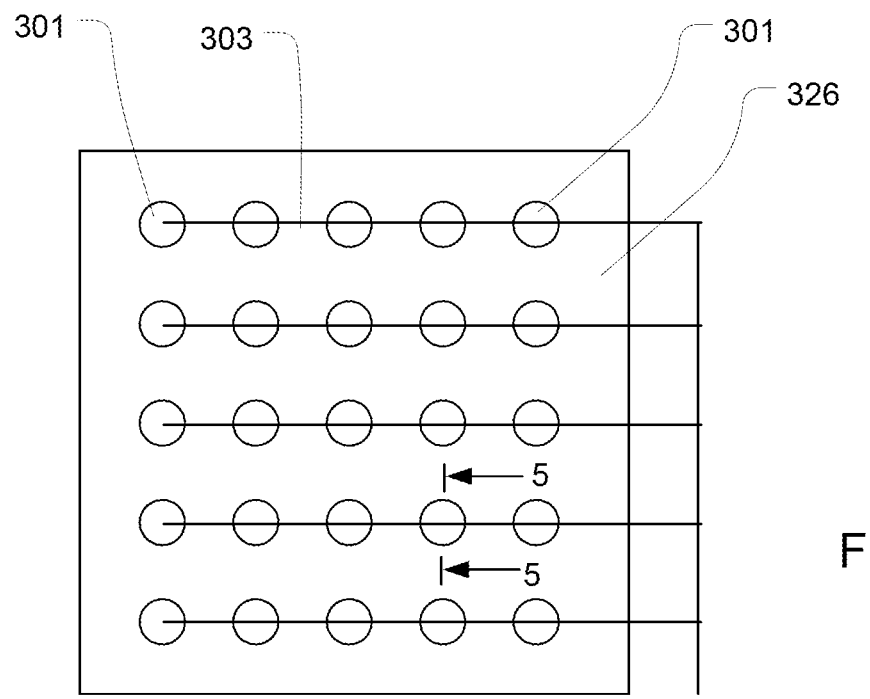
FIG. 4 is a diagrammatic plan view depicting a cell in accordance with yet another embodiment of the invention.
Figure 5:
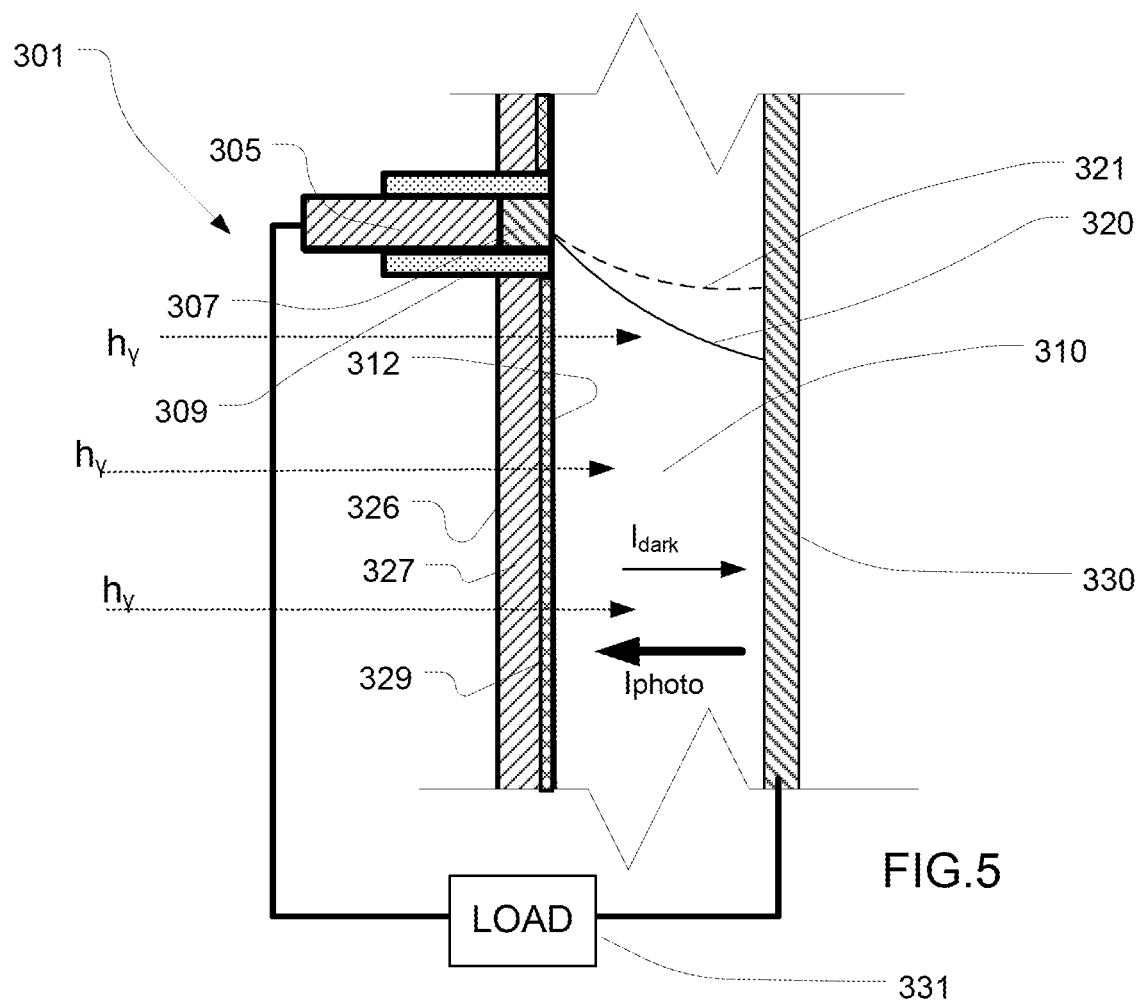
FIG. 5 is a diagrammatic sectional view taken along the line 5-5 in FIG. 4.

A cell in accordance with a further embodiment of the invention is depicted in FIGS. 4 and 5. The cell includes a first electrode incorporating a plurality of electrode elements 301 overlying the first surface 312 of the semiconductor element, one such element being shown in FIG. 5. The individual electrode elements are conductively connected to one another by wiring traces 303 schematically indicated in FIG. 4. The wiring traces desirably are as thin as practicable so that the wiring traces cover only the minimum required area of the first surface 312.

A biasing agent 326 also overlies the first surface 312 of the semiconductor element. Biasing agent 326 desirably covers a large portion of the first surface, referred to herein as the "first portion of such surface." By contrast, the electrode elements 301 desirably cover a second, smaller portion of the first surface 312. Stated another way, the electrode elements 301 are provided on areas of the first surface 312 where the biasing agent is not present. Each electrode element desirably includes one or more electrically conductive layers, such as metallic layers. In the particular embodiment shown, each electrode element 301 includes a first metallic layer 305 and a second metallic layer 307 in contact with the first surface. In other variants, only one metallic layer, or more than two metallic layers, may be used. An electrical insulator 309 surrounds each electrode element 301, so that the electrode elements, and hence the first electrode as a whole, are not in direct conductive contact with the biasing agent 326. The wiring traces 303 (FIG. 4) are also insulated from the biasing element. The biasing agent 326 desirably is transparent, but may be either a conductor or a highly doped semiconductor. For example, if the semiconductor 310 is n-type, the biasing agent 326 may include a thin layer of a p+ type semiconductor 327 and may optionally include a transition layer 329 between the p+ type semiconductor 327 and the semiconductor element defining surface 312 to improve lattice matching of these elements. The biasing agent does not form a portion of the conduction path through the cell, and is not part of the semiconductor element 310. Thus, here again, the semiconductor element 310 disposed between the electrodes is composed entirely of n-type semiconductor. The biasing of a wide-bandgap n-type semiconductor by a p+ agent may produce large amounts of band bending and a large built-in voltage. This may mitigate any reduction in built-in voltage caused by the a transition layer.

The cell is depicted as connected to an external load 331, such as a resistive load. In operation, light passes into the semiconductor body through the biasing agent, as indicated by arrows $h_Y$ in FIG. 5. However, regions of the body aligned with the electrode elements 301 remain substantially unilluminated. Accordingly, these regions will have no photogenerated carriers and will have far lower conductivity than the regions aligned with the biasing agent.

In regions of the semiconductor remote from the electrode elements, the cell operates much like the embodiments discussed above. Thus, a photocurrent symbolized by the arrow labeled $I_{PHOTO}$ flows in the thickness direction between the second electrode 330 and the first surface 312. Provided that the carrier concentration at the first surface 312 is high enough, the photocurrent in areas of the cell remote from electrode elements 301 will also flow in directions transverse to the thickness direction along surface 312 towards the electrode elements, so that the photocurrent will pass through the electrode elements and through external load 331 and back to the second electrode 330.

The voltage difference across load 331 appears as an external bias voltage between the electrode elements 301 of the first electrode and the second electrode. This external bias tends to counteract the effect of band bending. Stated another way, the external bias imposed by the load counteracts the electric field within the space charge region imposed by the biasing agent. For example, curve 320 schematically represents the conduction band of the semiconductor in the absence of the external bias voltage, whereas curve 321 schematically represents the conduction band in the presence of the external bias voltage. The effect reduces the field driving the carriers through the semiconductor and thus tends to reduce the photocurrent. Additionally, the external bias voltage tends to generate a current opposite to the photocurrent, as symbolized by the arrow $I_{DARK}$ in FIG. 5. This reduces the net current flowing in the cell.

However, because the external bias voltage is applied between the electrode elements 301 and the second electrode 330, these effects will occur primarily in regions of the semiconductor body aligned with the electrode elements. These regions constitute a relatively small portion of the cell. Because these regions of the semiconductor are substantially unilluminated and have very low carrier concentrations, $I_{DARK}$ will be smaller than it would be in a comparable cell having a first electrode covering the entire front surface. Also, those regions of the semiconductor remote from the electrode elements will undergo a lesser bias-related reduction in the electric field within the semiconductor. It is believed that these factors enhance the performance of a cell such as that shown in FIGS. 4 and 5.

Figure 6:
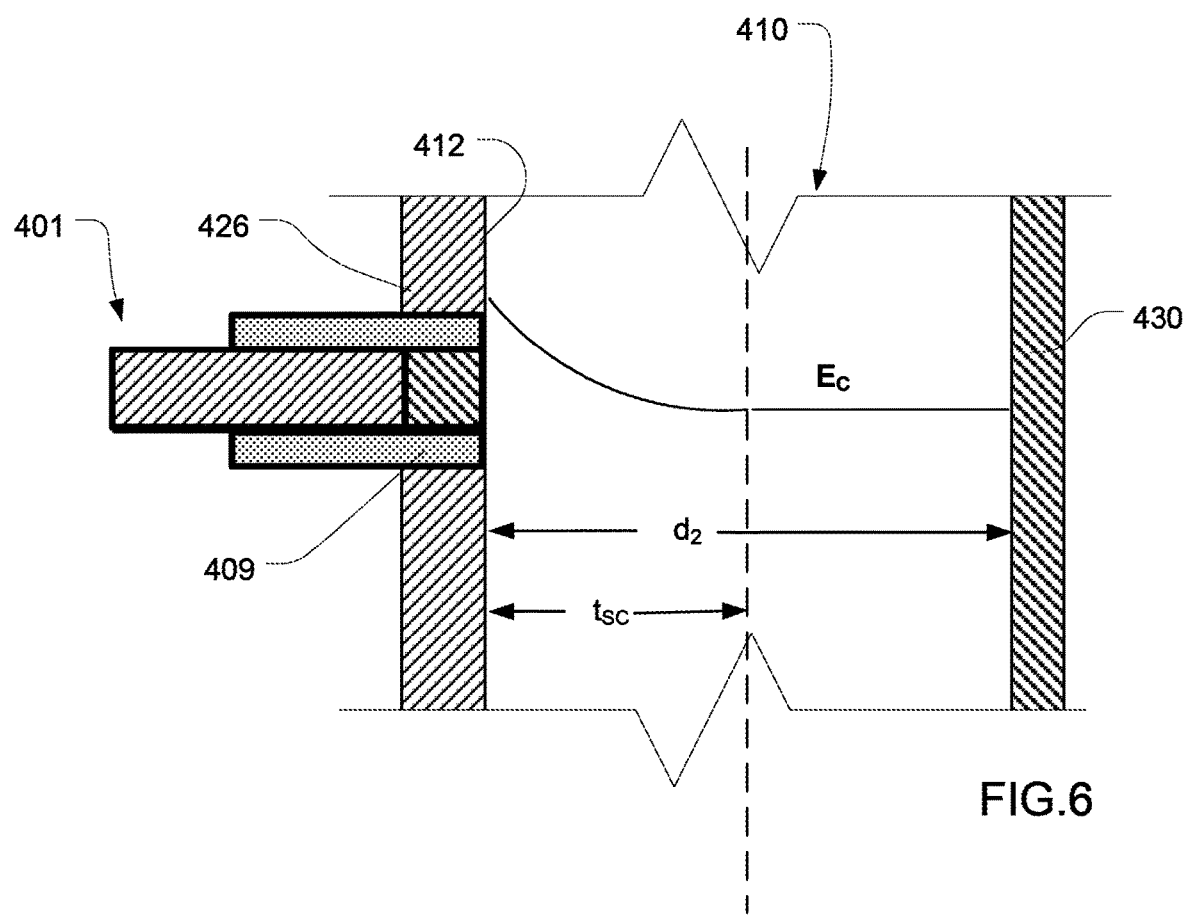
FIG. 6 is a diagrammatic sectional view similar to FIG. 5, but depicting a cell in accordance with yet another embodiment of the invention.

A cell according to a further embodiment of the invention (FIG. 6) includes a semiconductor element 410 formed from an indirect semiconductor as, for example, silicon. The cell has a first electrode incorporating a plurality of electrode elements 401, only one of which is depicted in FIG. 6. The electrode elements 401 are spaced apart from one another on the first surface 412 of the semiconductor element. The cell also includes a biasing agent 426 and an insulator 409 similar to those discussed above with reference to FIGS. 4 and 5. In this cell, the interaction between the biasing agent and semiconductor form a space charge region having a thickness $t_{SC}$ under dark, open-circuit conditions. A second electrode 430 is in contact with the semiconductor at a location outside of the space charge region. In this cell, the distance $d_2$ between the front surface 412 and second electrode 430 is greater than $t_{SC}$. The particular example depicted incorporates n-type semiconductor. In the region between the boundary 428 of the space charge region and the second electrode 430, there is no electric field under dark conditions. This is indicated by the flat portion of the conduction band $E_C$ schematically depicted in FIG. 6. In operation, electrons generated in the space charge region pass toward boundary 428 under the influence of the electric field in the space charge region and then diffuse from boundary 428 toward the second electrode 430. Because the semiconductor is an indirect semiconductor, the carriers will have sufficient life to reach the electrodes. In this cell, the use of spaced apart electrode elements 401 in conjunction with a biasing agent 426 insulated from the electrode elements provides benefits similar to those discussed above with reference to FIGS. 4 and 5.

Numerous variations and combinations of the elements discussed above can be employed. For example, in the embodiments discussed above with reference to FIGS. 4-6, the electrode elements need not be in the form of isolated circular elements as shown. In one variant, the electrode elements are in the form of elongated strips extending parallel to one another and spaced apart from one another in the direction transverse to the direction of elongation of the strips. In an arrangement including elongated strip electrode elements, the wiring traces 303 (FIG. 4) may be omitted. The metallic layers of the individual electrode elements may extend in the direction of elongation of the strip, and thus may serve to carry current to a common conductor. Other structures electrically connecting the individual electrode elements may be used.

In other embodiments, the various electrodes depicted as solid layers can be formed as composite electrodes, each including a set of elements spaced apart from one another. These elements may be opaque, but the composite electrode as a whole will be substantially transparent. In another variant, light may be directed into a cell such as that depicted in FIG. 2 or FIG. 3 through the rear surface of the semiconductor element.

In a further variant, the semiconductor element is formed as part of a larger semiconductor body that includes additional layers of semiconductor overlying the biasing agent and the first surface of the semiconductor. In this arrangement, the biasing agent is disposed within the larger semiconductor body. In this arrangement as well, the biasing agent overlies a face of the semiconductor element.

In the embodiments discussed above, the biasing agent is in direct contact with the semiconductor element. However, the biasing agent may be separated from the semiconductor element by a thin layer of an insulator as employed in a conventional MIS junction. For example, such an insulating layer can be used in place of the transition layer 329 depicted in FIG. 5. Such an arrangement is less preferred, as it reduces the built-in voltage $V_{BI}$.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A photovoltaic cell comprising:
    (a) a semiconductor element having first and second faces and a thickness direction between the faces;
    (b) a transparent biasing agent directly contacting a first portion of the first face, the biasing agent having a normal Fermi level different from the normal Fermi level of the semiconductor element such that the biasing agent produces a depletion region in the semiconductor element;
    (c) a first electrode overlying and directly contacting a second portion of the first face separate from the first portion, the first electrode being out of direct conductive contact with the biasing agent, the second portion of the first face being smaller than the first portion of the first face; and
    (d) a second electrode contacting the semiconductor element at a location spaced apart from the first face.

2. A photovoltaic cell as claimed in claim 1 wherein the semiconductor element has a first region extending from the first face to the second electrode, and wherein the first region is entirely p-type or entirely n-type.

3. A photovoltaic cell as claimed in claim 2 wherein the second electrode overlies and contacts at least a portion of the second face of the semiconductor element.

4. A photovoltaic cell as claimed in claim 1 wherein the first electrode includes a plurality of electrode elements spaced apart from one another on the first face of the semiconductor element, the electrode elements being conductively connected to one another, and wherein the biasing agent extends between the electrode elements.

5. A photovoltaic cell as claimed in claim 4 wherein each electrode element includes an electrically conductive material in contact with the first face and a dielectric material separating the conductive material from the biasing agent.

6. A photovoltaic cell as claimed in claim 4 wherein each said electrode element includes an opaque material.

7. A photovoltaic cell as claimed in claim 6 wherein the semiconductor element is a direct semiconductor.

8. A photovoltaic cell as claimed in claim 1 wherein the second electrode is in ohmic contact with the semiconductor element.

9. A photovoltaic cell as claimed in claim 8 wherein the second electrode includes a doped semiconductor layer in contact with the semiconductor element and a metal in contact with the doped semiconductor layer.

10. A photovoltaic cell as claimed in claim 1 wherein the biasing agent includes a metal in contact with the first face of the semiconductor element.

11. A photovoltaic cell as claimed in claim 1 wherein the biasing agent includes a doped semiconductor layer overlying the first face of the semiconductor element.

12. A photovoltaic cell as claimed in claim 1 wherein the semiconductor element is an n-type semiconductor and the normal Fermi level of the biasing agent is lower than the normal Fermi level of the semiconductor element.

13. A photovoltaic cell as claimed in claim 12 wherein the semiconductor element is selected from the group consisting of III-V semiconductors, II-VI semiconductors and Group IV semiconductors.

14. A photovoltaic cell as claimed in claim 1 wherein the semiconductor element is a direct semiconductor.

15. A circuit including a photovoltaic cell as claimed in claim 1 and a load electrically connected to the first electrode and the second electrode of the photovoltaic cell.

* * * * *